United States Patent [19]

Saito

[11] Patent Number: 5,623,440
[45] Date of Patent: Apr. 22, 1997

[54] MULTIPLE-BIT RANDOM ACCESS MEMORY CELL

[75] Inventor: Tamio Saito, Redwood Shores, Calif.

[73] Assignee: Solidas Corporation, San Jose, Calif.

[21] Appl. No.: 422,142

[22] Filed: Apr. 13, 1995

Related U.S. Application Data

[63] Continuation-in-part of Ser. No. 136,161, Oct. 15, 1993, Pat. No. 5,459,686.

[51] Int. Cl.⁶ ..................................... G11C 11/24
[52] U.S. Cl. ................ 365/149; 365/168; 365/156
[58] Field of Search ............... 365/45, 149, 168, 365/189.09, 189.11, 206, 210, 154, 156

[56] References Cited

U.S. PATENT DOCUMENTS

| | | | |
|---|---|---|---|
| 4,368,523 | 1/1983 | Kawate | 365/149 X |
| 4,441,169 | 4/1984 | Sasaki et al. | 365/154 X |
| 4,447,892 | 5/1984 | Zibu | 365/156 |
| 4,661,929 | 4/1987 | Aoki et al. | 365/149 X |
| 5,111,072 | 5/1992 | Seidel | 307/353 |
| 5,184,324 | 2/1993 | Ohta | 365/149 |
| 5,187,390 | 2/1993 | Scott, III | 307/353 |
| 5,353,251 | 10/1994 | Uratani et al. | 365/154 X |
| 5,459,686 | 10/1995 | Saito | 365/149 |

FOREIGN PATENT DOCUMENTS

| | | |
|---|---|---|
| 0275590 | 7/1988 | European Pat. Off. . |
| 60-239994 | 11/1985 | Japan . |
| 62-008400 | 1/1987 | Japan . |
| 62-2650 | 1/1987 | Japan . |
| 63-195896 | 8/1988 | Japan . |
| 63-195897 | 8/1988 | Japan . |
| 1-192083 | 8/1989 | Japan . |

OTHER PUBLICATIONS

Ishizuka, O., et al. "On Design of Multiple-Valued Static Random-Access-Memory", *Proceedings of the Twentieth International Symposium of Multiple-Valued Logic*, May 23–25, 1990, Charlotte, NC, pp. 11–17.

Primary Examiner—Joseph A. Popek
Attorney, Agent, or Firm—Bobby K. Truong; Edward B. Weller; Fenwick & West LLP

[57] ABSTRACT

An improved multi-bit memory cell includes a storage capacitor and a switching element coupled to one of the terminals of the capacitor. The switching element includes a first switching component having a positive threshold, and a complementary switching component having a negative threshold. Because the switching element is constructed in this manner, noise generation caused by activation of the switching components is significantly reduced, and cut-off effects are eliminated. Both of these factors contribute to the memory cell's ability to store more bits of information than prior art memory cells.

15 Claims, 5 Drawing Sheets

MULTIPLE-BIT RANDOM ACCESS MEMORY CELL

RELATED APPLICATIONS

This application is a continuation-in-part of U.S. patent application Ser. No. 08/136,161, filed on Oct. 15, 1993, now U.S. Pat. No. 5,459,686.

FIELD OF THE INVENTION

This invention relates generally to random access memories having multi-bit memory cells, and more particularly to an improved random access memory cell capable of storing a large number of bits of data.

BACKGROUND OF THE INVENTION

As computers have grown in complexity, the demand for more memory has grown. This in turn has led to a greater demand for higher density memories (memories capable of storing more bits of information in the same semiconductor surface area). In an attempt to increase the storage density of memories, the concept of a multi-bit memory cell was developed. More specifically, it was envisioned that if each memory cell were able to store more than one bit of data, then the storage density of the memory would be increased. Consequently, efforts have been made in recent years to develop memories using multi-bit memory cells. Most of the multi-bit memory cell work has been done in connection with DRAM memory cells.

In general, a multi-bit DRAM cell has the same construction as a single-bit DRAM cell, consisting of a storage capacitor and a cell gate. The difference between the multi-bit cell and the single-bit cell is manifested in the way the cells are used. To illustrate how a single memory cell can be used to store a plurality of bits of data, suppose that it is desirable to store two bits of data in a memory cell, and that the voltages to be stored in the memory cell range from 0 to 4 volts. In order to use the memory cell as a two-bit memory cell, the voltage range is first divided into four distinct voltage sub-ranges: (1) 0 to 1 volt; (2) 1 to 2 volts; (3) 2 to 3 volts; and (4) 3 to 4 volts. Each voltage sub-range represents a certain combination of two data bits. For example, the first sub-range can represent the data bits "00", the second sub-range can represent the data bits "01", the third sub-range can represent the data bits "10". and the fourth sub-range can represent the data bits "11". Once the voltage range is subdivided in this manner, two-bit data can be stored in the memory cell by applying and storing an appropriate voltage in the cell. For example, the data bits "10" can be stored in the memory cell by storing a voltage between 2 and 3 volts in the memory cell. Likewise, the data bits "11" can be stored in the memory cell by storing a voltage between 3 and 4 volts in the memory cell. Thus, by dividing the full voltage range into voltage sub-ranges, and then storing appropriate voltage levels in the memory cell, a single-bit memory cell can be converted into a multi-bit memory cell. This same concept can be extended to store three or more data bits per cell. In general, to store an n number of bits in a single cell, $2^n$ distinct voltage sub-ranges will need to be created.

To maximize the information density of a memory, it is desirable to store as many bits of information in each cell as possible. In the prior art cells, two major factors have significantly limited the number of bits that can be stored in each cell. The first factor is noise. As noted above, to store more bits of information in a cell, more voltage sub-ranges need to be created. The more voltage sub-ranges that are created, the smaller the voltage separation between voltage sub-ranges becomes. At some point, the separation between sub-ranges becomes sufficiently small that noise signals can alter the data stored in the cell. Unless these noise signals are somehow reduced or canceled, they can seriously undermine the reliability of the data stored in the memory cell. Noise has been a serious and nagging problem in prior art memory cells.

Another major limiting factor is that of voltage range limitation. This limitation is caused by cell gate cut-off. To elaborate, a cell gate of a typical memory cell is an n-channel MOSFET. For this type of transistor, the resistance is given approximately by the following equation:

$$R_{FET} \cong L/WK(V_{GS}-V_T),$$

where $R_{FET}$ is the resistance of the transistor, L is the length of the conducting channel, W is the width of the conducting channel, K is the transconductance parameter, $V_{GS}$ is gate-to-source voltage, and $V_T$ is the threshold voltage of the transistor. As can be seen from the above equation, as $V_{GS}$ approaches $V_T$, the resistance of the transistor increases. Finally, the transistor will shut off when $V_{GS}$ becomes equal to $V_T$. A point to note here is that the source of the transistor is coupled to the storage capacitor. Thus, the voltage at the source of the transistor is the same as the voltage stored in the capacitor. Since $V_{GS}$ is the voltage between the gate and the source terminal of the transistor, and since the source voltage is the same as the stored voltage, the higher the voltage stored within the capacitor becomes, the lower $V_{GS}$ becomes, assuming that the gate voltage remains fairly constant. At some point, the voltage stored in the capacitor becomes large enough that $V_{GS}$ is reduced to $V_T$. At that point, conduction stops (i.e. the cell gate cuts off). It has been found that in typical memory cells designed to operate between 0 and 5 volts, cut-off occurs when the voltage stored in the capacitor reaches about 3.5 volts. As shown by this discussion, even though the operating voltage range is from 0 to 5 volts, the actual dynamic range of the memory cell is only from 0 to 3.5 volts. This cut-off effect significantly limits the dynamic range of the memory cell, which in turn limits the number of data bits that can be stored within the cell.

A similar effect is observed for p-channel cell gates, except that for p-channel cell gates, cut-off occurs below 1.4 volts. Thus, the dynamic range for a p-channel cell gate memory cell is between 1.4 volts and 5 volts. With either type of cell gate, the dynamic range of the memory cell is limited. In view of the shortcomings noted above for the prior art memory cells, an improved multi-bit memory cell is needed.

SUMMARY OF THE INVENTION

In accordance with the present invention, there is provided an improved multi-bit memory cell structure which reduces noise effects and which overcomes the range-diminishing effects caused by cell gate cut-off. The memory cell of the present invention preferably comprises a storage capacitor, an isolating element coupled to one of the terminals of the capacitor, and a switching element coupled to the other terminal of the capacitor. The switching element preferably comprises a set of complementary switching components. More specifically, the switching element preferably comprises a first switching component having a positive threshold voltage (such as an n-channel enhancement MOSFET, an npn bipolar transistor, an n-type JFET, an n-channel enhancement MESFET, an n-channel enhancement MISFET, etc.) and a second switching component having a negative threshold voltage (such as a p-channel enhancement MOSFET, a pnp bipolar transistor, a p-type JFET, a p-channel enhancement MESFET, a p-channel enhancement MISFET, etc.).

The switching element serves at least two major purposes. First, because the switching components in the switching element are complementary, they will generate noise signals which will substantially cancel each other out. Thus, noise effects caused by switching are reduced. Second, because the switching components have complementing thresholds (i.e. one has a positive threshold and one has a negative threshold), at least one of the components will always be able to conduct. Thus, the cut-off effect described above is eliminated. As a result, the memory cell of the present invention will be able to store voltages in the entire operating voltage range (0 to 5 volts, for example). This, in turn, means that more bits of data can be stored within the memory cell of the present invention.

Noise is further reduced in the memory cell of the present invention by the isolating element. This element serves to electrically isolate the capacitor from the neighboring components and circuits to prevent noise from affecting the voltage stored within the capacitor. By limiting and reducing the effects of noise, it is possible to divide the dynamic voltage range of the memory cell of the present invention into more voltage sub-ranges having smaller voltage separations. The more voltage sub-ranges that can be created, the larger the number of bits that can be stored in the cell. Overall, the memory cell of the present invention has significantly greater storage capacity than the prior art memory cells.

DETAILED DESCRIPTION OF THE PREFERRED EMBODIMENTS

In addition to the description provided below, all of the materials contained in co-pending patent application, Ser. No. 08/136,161 filed on Oct. 15, 1993, are incorporated herein by this reference.

Figure 1:
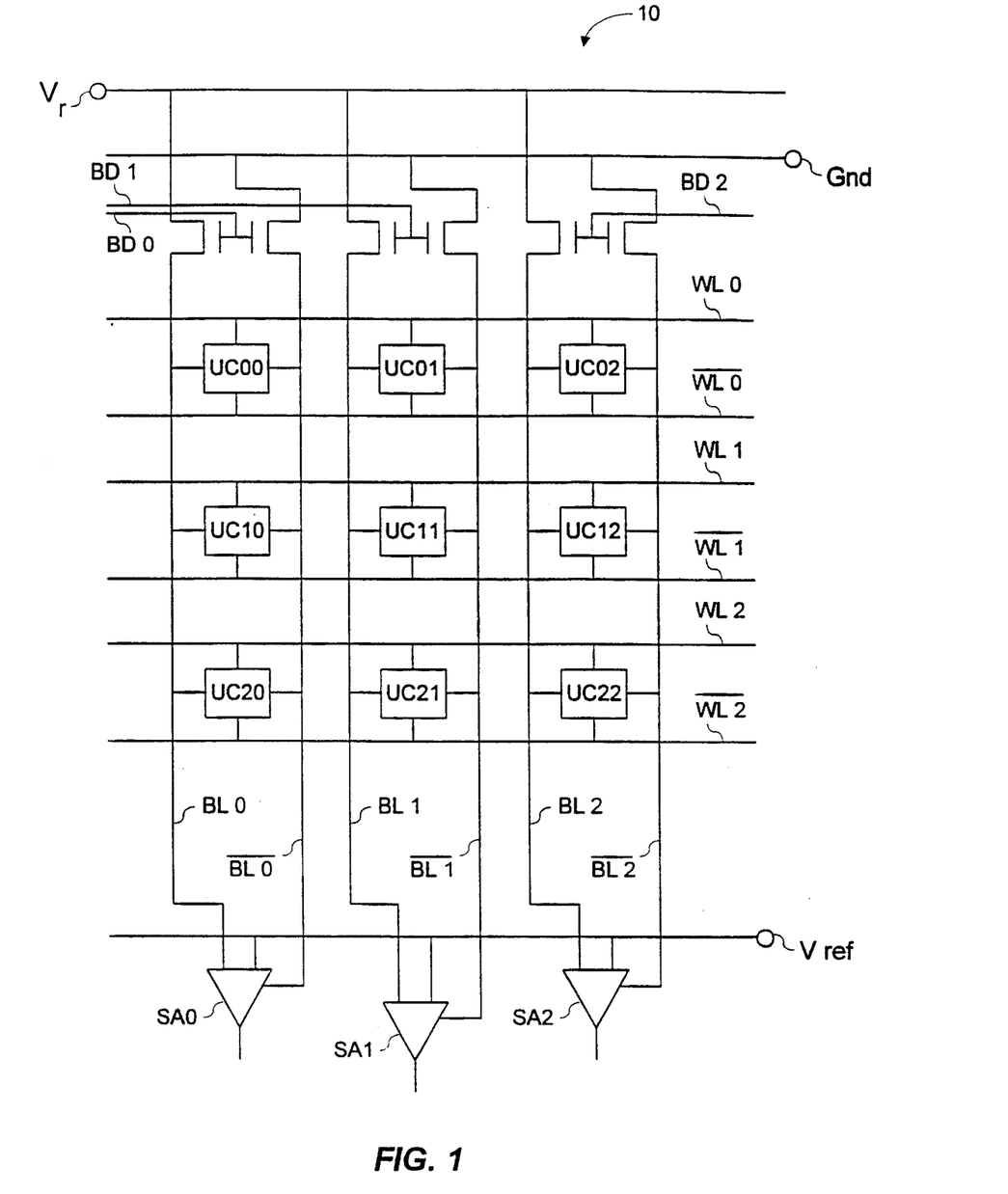
FIG. 1 depicts a portion of a random access memory wherein the memory cell of the present invention is implemented.

With reference to FIG. 1, there is shown a portion of a memory wherein the present invention is implemented, the memory 10 preferably comprising a plurality of multi-bit memory cells UC00–UC22 arranged in rows and columns. Each of the memory cells is preferably capable of storing a plurality of bits of data. For each column of cells, there is a pair of corresponding complementary bit lines (BL0 and $\overline{BL0}$, BL1 and $\overline{BL1}$, BL2 and $\overline{BL2}$) coupled to each of the cells in that column. In addition to being coupled to each of the cells in a particular column, each pair of complementary bit lines is also coupled to a corresponding bit driver line (BL0, BL1, BL2). As will be explained, the bit driver lines and the complementary bit lines are used to store a voltage found on the input voltage line Vr into the memory cells UC00–UC22. Preferably, the complementary bit lines (BL0 and $\overline{BL0}$, BL1 and $\overline{BL1}$, BL2 and $\overline{BL2}$) are further coupled to corresponding sense amps (SA0, SA1, SA2). As will be explained, the sense amps and the bit lines are used to read data out of the memory cells.

Coupled to each row of the memory cells are complementary word lines (WL0 and $\overline{WL0}$, WL1 and $\overline{WL1}$, WL2 and $\overline{WL2}$). These word lines are used to control the activation (i.e. the conduction) of the memory cells. Together, the word lines and the bit lines control which memory cell is accessed, both for reading and writing purposes.

Figure 2:
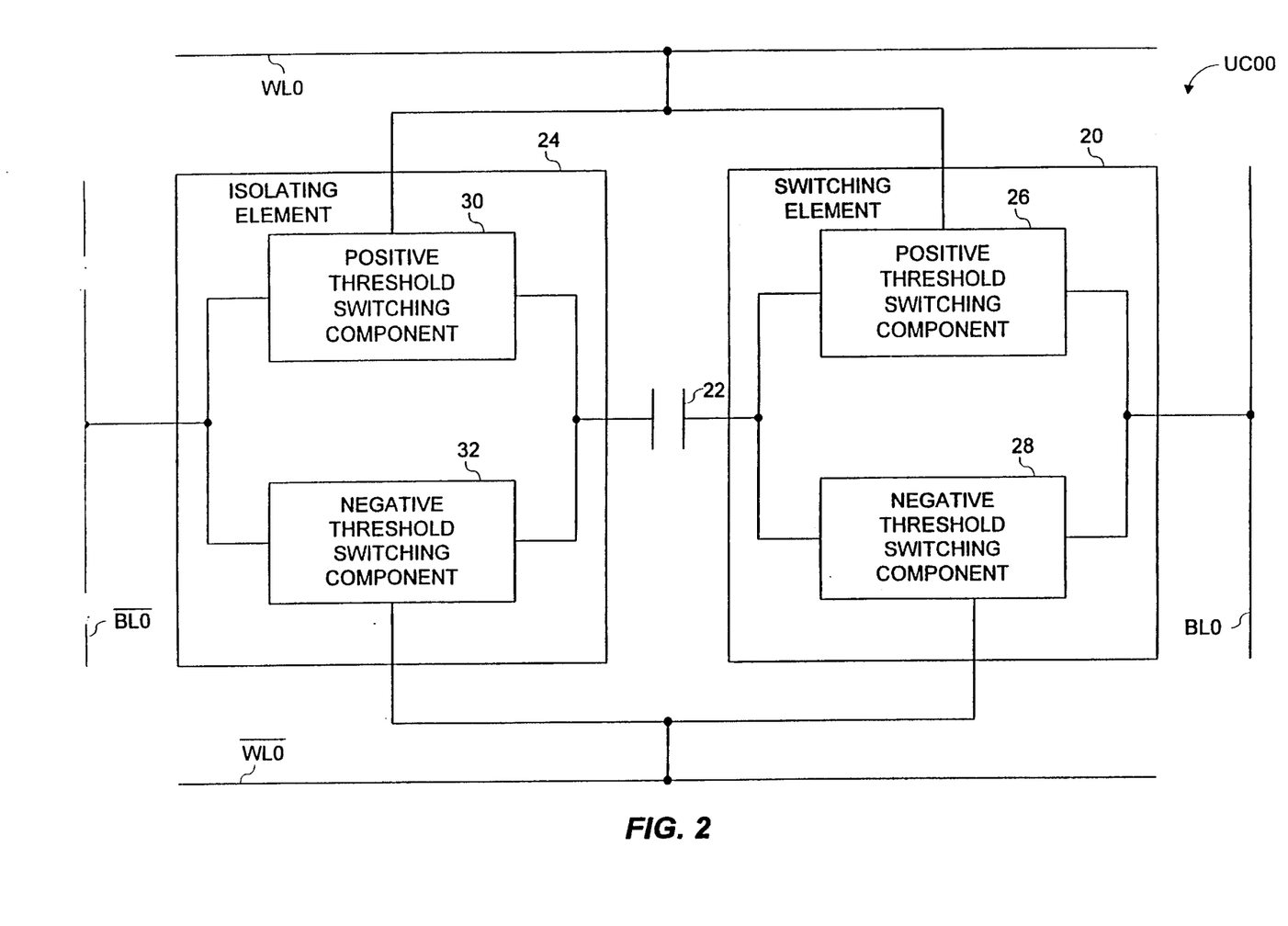
FIG. 2 is a block diagram representation of the memory cell of the present invention.

With reference to FIG. 2, the structure of each of the memory cells will now be described in detail. For the sake of convenience, only memory cell UC00 is shown in FIG. 2, but it should be understood that each of the memory cells UC00–UC22 preferably has the same construction. As shown, memory cell UC00 preferably comprises a switching element 20, a storage capacitor 22, and an isolating element 24. The switching element 20 preferably has a first terminal coupled to bit line BL0, a second terminal coupled to the storage capacitor 22, and a plurality of control terminals coupled to complementary word lines WL0 and $\overline{WL0}$. The switching element 20 preferably comprises at least two complementary switching components, with one switching component 26 having a threshold voltage which is positive, and one switching component having a threshold voltage which is negative. By positive threshold voltage, it is meant that switching component 26 will conduct (i.e. turn on) when a positive voltage having a sufficient magnitude exists between the control terminal of the switching component 26 and the capacitor 22. Likewise, by negative threshold voltage, it is meant that switching component 28 will conduct when a negative voltage having a sufficient magnitude exists between the control terminal of the switching component 28 and the capacitor 22. The positive threshold switching component 26 preferably has a first terminal coupled to the bit line BL0, a second terminal coupled to the capacitor 22, and a control terminal coupled to word line WL0. Likewise, the negative threshold switching component 28 preferably has a first terminal coupled to the bit line BL0, a second terminal coupled to the capacitor 22, and a control terminal coupled to word line $\overline{WL0}$. The general function of switching element 20 is to selectively couple the capacitor 22 to the bit line BL0 in response to control signals received on the word lines WL0, $\overline{WL0}$. This allows data to be selectively read from and written to cell UC00.

The construction of switching element 20 is advantageous in at least two respects. First, the positive and negative threshold components 26, 28 are complementary devices. This means that when they both conduct, they generate complementary noise signals which cancel each other out. This serves to significantly reduce the amount of switching noise that is passed on to the capacitor 22, which in turn, reduces the impact of noise on the data stored in the capacitor 22. Second, because one of the switching components 26 has a positive threshold, and the other 28 has a negative threshold, switching element 20 does not suffer from the cut-off effect described above. As long as a sufficient voltage is applied to the word lines WL0, $\overline{WL0}$, at least one of the components 26, 28 will be able to conduct to couple the capacitor 22 to the bit line BL0, regardless of the voltage stored in the capacitor. This means that memory cell UC00 can store voltages within the entire dynamic operating voltage range, free of any cut-off effects. Since memory cell UC00 is able to store voltages in a wider voltage range than the prior art cells, memory cell UC00 is capable of storing more data than the prior art memory cells.

The isolating element 24 preferably has substantially the same construction as switching element 20. Element 24 preferably comprises a positive threshold switching component 30 and a negative threshold switching component 32. Component 30 preferably has a first terminal coupled to the capacitor 22, a second terminal coupled to the bit line $\overline{BL0}$, and a control terminal coupled to word line WL0, while component 32 preferably has a first terminal coupled to the capacitor 22, a second terminal coupled to the bit line $\overline{BL0}$, and a control terminal coupled to word line $\overline{WL0}$. The general function of element 24 is to electrically isolate memory cell UC00 from other neighboring circuit components. When it is non-conducting (i.e. off), element 24 prevents signals on bit line $\overline{BL0}$ from affecting the data stored in capacitor 22. When conducting, element 24 couples the capacitor 22 to the bit line $\overline{BL0}$.

In implementing the memory cell of the present invention, a number of different switching devices can be used as the positive and negative threshold switching components 26, 28, 30, 32. Examples of positive threshold switching devices include n-channel enhancement metal oxide semiconductor field effect transistors (MOSFET), npn bipolar junction transistors (BJT), n-type junction field effect transistors (JFET), n-channel enhancement metal electrode semiconductor field effect transistors (MESFET), and n-channel metal insulator semiconductor field effect transistor (MISFET). Examples of negative threshold switching devices include p-channel enhancement MOSFET's, pnp BJT's, p-type JFET's, p-channel enhancement MESFET's, and p-channel MISFET's. Which devices are used is a matter of design choice.

Figure 3:
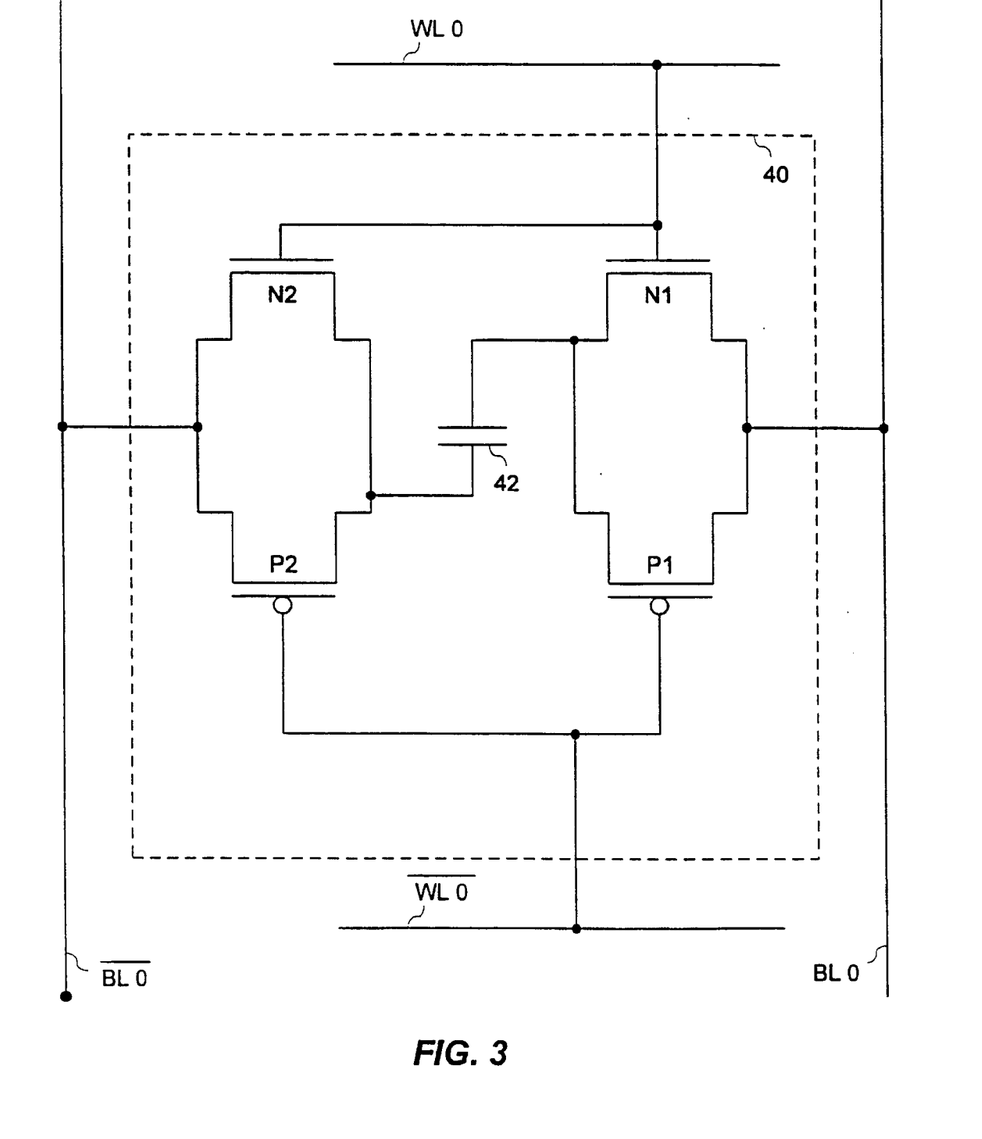
FIG. 3 is a circuit diagram of the memory cell of the present invention.

With reference to FIG. 3, there is shown a preferred embodiment of the present invention wherein the memory cell UC00 is implemented using MOSFET's. As shown in FIG. 3, the memory cell 40 preferably comprises a storage capacitor 42, two n-channel enhancement MOSFET's N1, N2, and two p-channel enhancement MOSFET's P1, P2. Together, transistors N1 and P1 form the switching element 20 of FIG. 1, and together, transistors N2 and P2 form the isolating element 24 of FIG. 1. Transistor N1 preferably has a drain terminal coupled to bit line BL0, a source terminal coupled to a first terminal of the capacitor 42, and a gate terminal coupled to write line WL0. Transistor P1 preferably has a drain terminal coupled to bit line BL0, a source terminal coupled to the first terminal of the capacitor 42, and a gate terminal coupled to write line $\overline{WL0}$. Transistor N2 preferably has a drain terminal coupled to a second terminal of the capacitor 42, a source terminal coupled to bit line $\overline{BL0}$, and a gate terminal coupled to write line WL0. Transistor P2 preferably has a drain terminal coupled to the second terminal of the capacitor 42, a source terminal coupled to bit line $\overline{BL0}$, and a gate terminal coupled to write line $\overline{WL0}$. Other types of field effect transistors (FET's), such as the ones noted above, may be substituted for MOSFET's N1, N2, P1, and P2. The configuration just described may be used for all implementations where FET's are used.

In the case where bipolar junction transistors are employed, N1 and N2 are preferably implemented using npn BJT's, and P1 and P2 are preferably implemented using pnp BJT's. In such an implementation, transistor N1 preferably has a collector terminal coupled to bit line BL0, an emitter terminal coupled to a first terminal of the capacitor 42, and a base terminal coupled to write line WL0. Transistor P1 preferably has a collector terminal coupled to bit line BL0, an emitter terminal coupled to the first terminal of the capacitor 42, and a base terminal coupled to write line $\overline{WL0}$. Transistor N2 preferably has a collector terminal coupled to a second terminal of the capacitor 42, an emitter terminal coupled to bit line $\overline{BL0}$, and a base terminal coupled to write line WL0. Further, transistor P2 preferably has a collector terminal coupled to the second terminal of the capacitor 42, an emitter terminal coupled to bit line $\overline{BL0}$, and a base terminal coupled to write line $\overline{WL0}$. Connected in this manner, the BJT implementation would function in substantially the same manner as the MOSFET implementation shown in FIG. 3.

Figure 4:
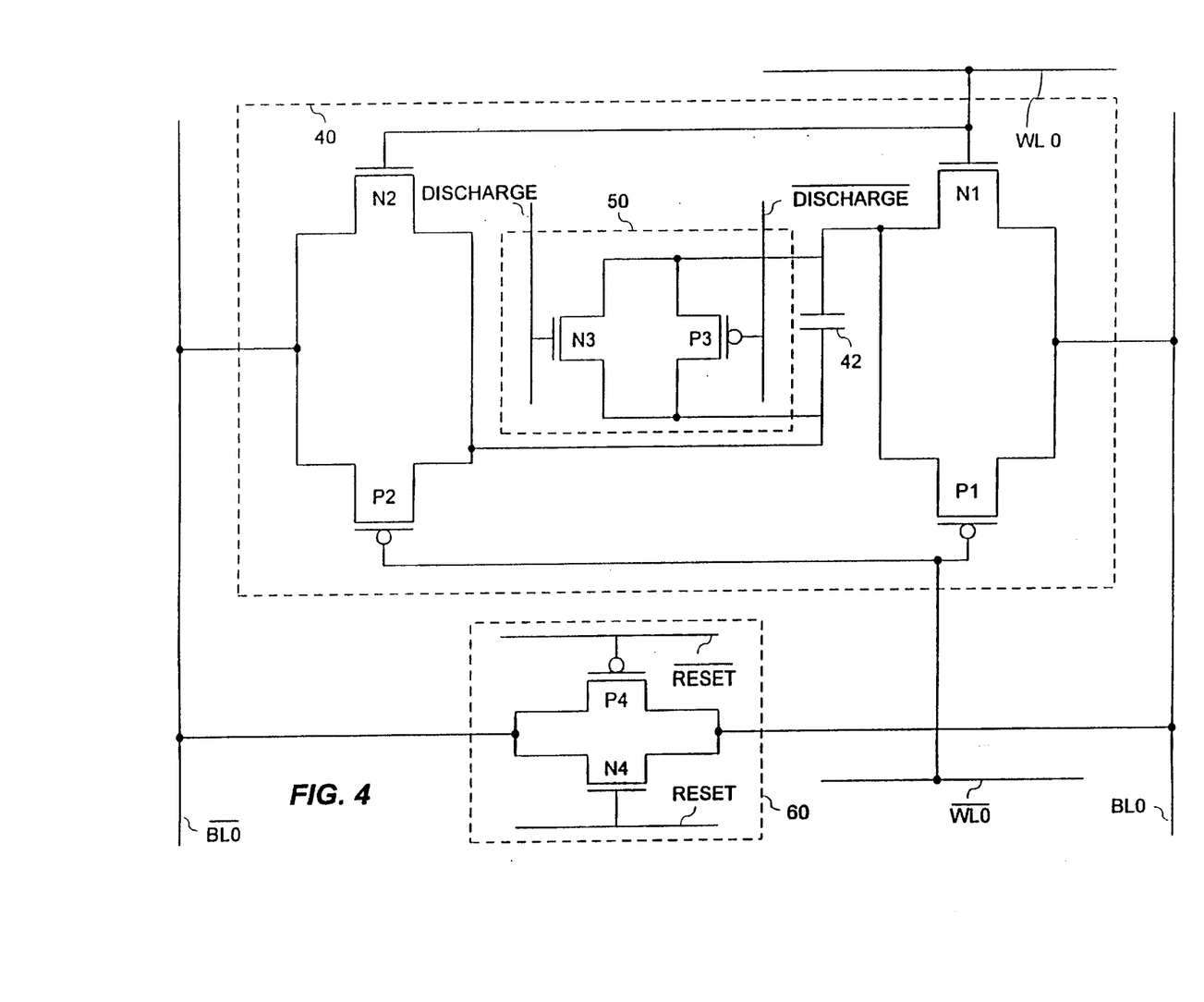
FIG. 4 is another circuit diagram of the memory cell of the present invention, further showing a discharge element 50 coupled to the storage capacitor 42, and a second discharge element 60 (which is not a part of the memory cell 40) coupled to the complementary bit lines.

Thus far, only the basic memory cell 40 has been described. Optionally, other elements may be added to the cell 40 to further enhance performance. FIG. 4 shows a memory cell of the present invention wherein a discharge element 50 is added to the cell. Discharge element 50 preferably has a first terminal coupled to the first terminal of the capacitor 42, a second terminal coupled to the second terminal of the capacitor 42, and two control terminals coupled to the complementary discharge control lines (Discharge and $\overline{Discharge}$). The primary function of discharge element 50 is to remove charge from the capacitor 42 before new data is stored in the capacitor 42. This prevents any leftover charge from affecting or altering the new data being stored in the capacitor 42.

The discharge element 50 preferably has substantially the same construction as the switching 20 and isolating elements 24. More specifically, element 50 preferably comprises a pair of complementary switching components, with one component having a positive threshold voltage and the other having a negative threshold voltage. In the preferred embodiment shown in FIG. 4, element 50 comprises an n-channel enhancement MOSFET N3 (acting as the positive threshold component) and a p-channel enhancement MOSFET P3 (acting as the negative threshold component). Transistor N3 preferably has a drain terminal coupled to the first terminal of the capacitor 42, a source terminal coupled to the second terminal of the capacitor 42, and a gate terminal coupled to the discharge line (Discharge). Likewise, transistor P3 preferably has a drain terminal coupled to the first terminal of the capacitor 42, a source terminal coupled to the second terminal of the capacitor 42, and a gate terminal coupled to the discharge line ($\overline{Discharge}$). Of course, other similar devices, such as BJT's and other types of FET's may be used instead of the MOSFET's shown in FIG. 4.

As a further enhancement to the memory circuit, yet another discharge element 60 may be included. Note that this discharge element 60 is preferably not a part of the memory cell 40. Discharge element 60 preferably has a first terminal coupled to bit line BL0, a second terminal coupled to bit line $\overline{BL0}$, and two control terminals coupled to the complementary reset control lines (Reset and $\overline{Reset}$). The primary function of element 60 is to remove leftover charge from the complementary bit lines before reading and writing operations so that the leftover charge does not affect the data being read or written.

The discharge element 60 preferably has substantially the same construction as the discharge element 50. More specifically, discharge element 60 preferably comprises a pair of complementary switching components, with one component having a positive threshold voltage and the other having a negative threshold voltage. In the preferred embodiment shown in FIG. 4, element 60 comprises an n-channel enhancement MOSFET N4 (acting as the positive threshold component) and a p-channel enhancement MOSFET P4 (acting as the negative threshold component). Transistor N4 preferably has a drain terminal coupled to the bit line BL0, a source terminal coupled to the bit line $\overline{BL0}$, and a gate terminal coupled to the reset line (Reset). Likewise, transistor P4 preferably has a drain terminal coupled to the bit line BL0, a source terminal coupled to the bit line $\overline{BL0}$, and a gate terminal coupled to the reset line ($\overline{Reset}$). If so desired, other devices such as BJT's and other types of FET's may be used in place of the MOSFET's shown in FIG. 4.

With reference to FIGS. 1 and 4, the operation of memory 10 will now be described. The writing cycle will be described first. For the sake of illustration, it will be assumed that memory cell UC00 is the cell to which data will be written. The write cycle begins with reset signals being sent on the reset lines (Reset and $\overline{Reset}$). These signals cause transistors N4 and P4 to become conductive, which in turn, causes bit lines BL0 and $\overline{BL0}$ to be discharged. This process serves to cleanse the bit lines to get them ready for the write operation. Also, discharge signals are sent onto the discharge lines (Discharge and $\overline{Discharge}$) to activate transistors N3 and P3. This causes capacitor 42 to be discharged, thereby making it ready to receive the new data. Once that is done, bit driver line BD0 is activated, to allow the voltage appearing on the input voltage line Vr to reach bit line BL0. The voltage on line Vr will increment with each clock cycle, as is known in the art. When the voltage on line Vr reaches the desired voltage (representing the desired data bits), then activation signals are sent onto word lines WL0 and $\overline{WL0}$ to turn on transistors N1, N2, P1, and P2. This in effect allows the voltage appearing on bit line BL0 to be loaded into the storage capacitor 42. Thereafter, the activation signals are removed from the word lines WL0, $\overline{WL0}$ to once again render the transistors N1, N2, P1, P2 non-conductive, thereby storing the desired voltage within the capacitor 42. The write cycle is thus complete.

For the read cycle, a similar process is carried out. To read data from memory cell UC00, reset signals are first sent onto the reset lines (Reset and $\overline{Reset}$) to cause transistors N4 and P4 to remove any leftover charge from the bit lines BL0, $\overline{BL0}$. Then, activation signals are sent onto word lines WL0 and $\overline{WL0}$ to activate transistors N1, N2, P1, and P2. This allows the voltage stored in the capacitor 42 to be transferred onto bit line BL0. Thereafter, the sense amp SA0 receives the voltage from memory cell UC00 and compares it with a reference voltage appearing on line Vref. Like the voltages appearing on input line Vr, the voltages on line Vref are preferably incremented each clock cycle. Eventually, the voltage from cell UC00 will match one of the voltages appearing on line Vref. The voltage, and hence the data, stored in the memory cell UC00 is thus ascertained.

In the reading method just described, the output voltage from the memory cell UC00 is compared directly with the voltage on line Vref. It should be noted that cell UC00 may also be read using a comparison method involving a dummy cell. This method will be described with reference to the memory portion 70 shown in FIG. 5. As shown, memory portion 70 preferably comprises a plurality of bit lines BL0, BL1 with each bit line BL0, BL1 having a plurality of memory cells UC00, UC10, UC20, UC01, UC11, UC21 coupled thereto. In addition to the memory cells, a pair of dummy cells 72, 74 are also coupled to the bit lines BL0, BL1. Preferably, all of the cells in FIG. 5, including both the memory cells UC00, UC10, UC20, UC01, UC11, UC21 and the dummy cells 72, take the form of the memory cell of the present invention. The bit lines BL0, BL1 are attached at one end to the inputs of a comparator 76, and at the other end to switches 78 and 80. Switches 78, 80 selectively couple the bit lines BL0, BL1 to the reference voltage line Vref, the input voltage line Vr, or to neither. Also preferably included in memory portion 70 is a discharge element 82 coupled to both of the bit lines BL0, BL1. Discharge element 82 serves substantially the same function as discharge element 60 of FIG. 4, and preferably has the same construction.

Figure 5:
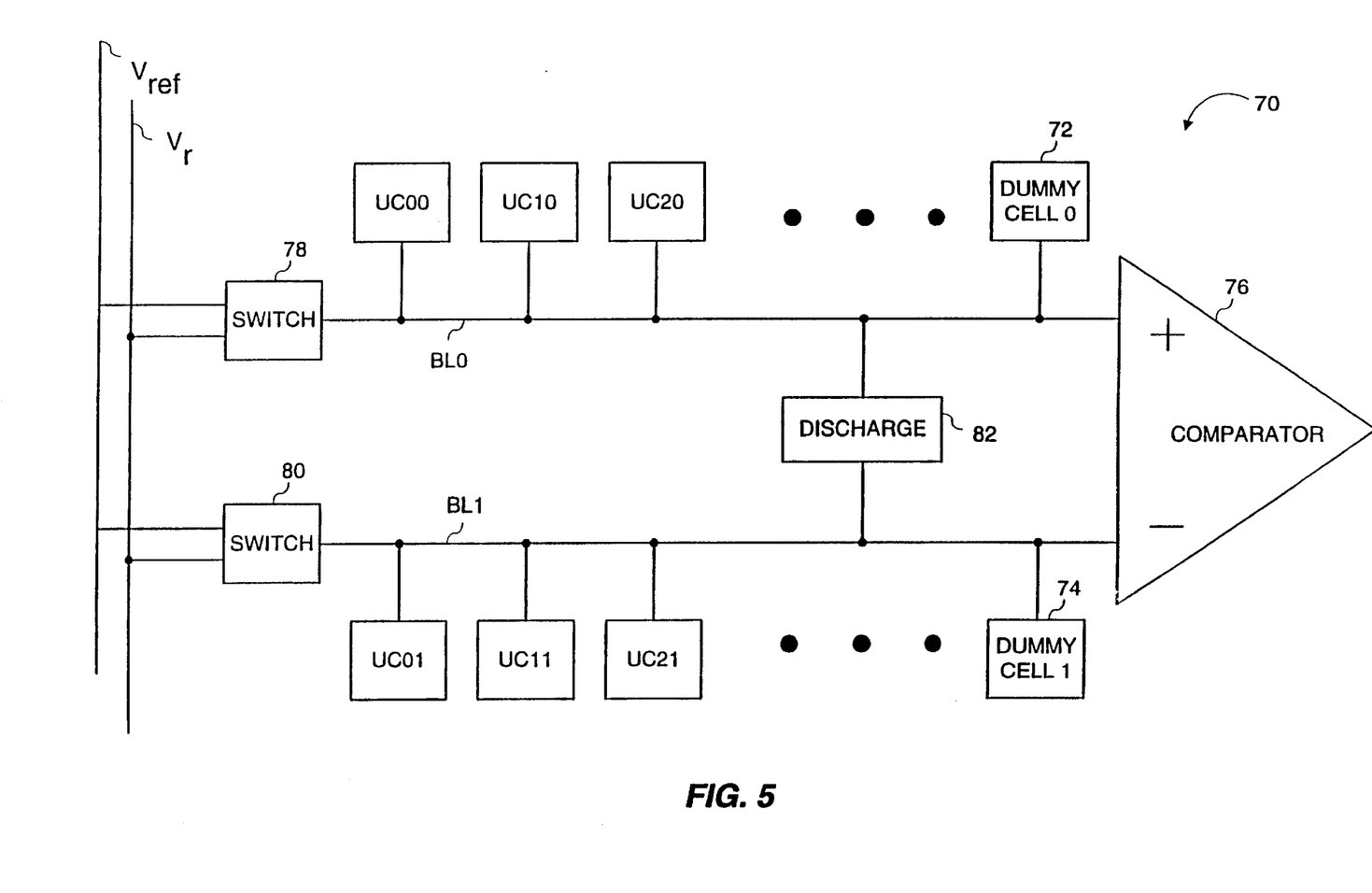
FIG. 5 depicts a portion of a memory (including a dummy cell) wherein the memory cell of the present invention is implemented to illustrate how a dummy cell may be used to read data from the memory cell.

To read data from one of the memory cells, memory cell UC00 for example, the bit lines BL0, BL1 are first discharged by activating discharge element 82. Once the bit lines are cleansed, switch 80 is activated (i.e. turned on) to couple line Vref to bit line BL1, thereby passing a reference voltage appearing on line Vref onto bit line BL1. Thereafter, the dummy cell 74 is rendered conductive to receive the voltage appearing on bit line BL1. Once that is done, dummy cell 74 is rendered non-conductive to store the received voltage, and switch 80 is deactivated to decouple bit line BL1 from line Vref. Thereafter, both the memory cell UC00 and the dummy cell 74 are rendered conductive to transfer the voltages stored within the cells onto bit lines BL0 and BL1 to allow the comparator 76 to compare the voltages from the two cells UC00, 74. The above process is preferably repeated for each increment of the voltage on line Vref. Eventually, the voltage in cell UC00 will match a voltage in the dummy cell 74. The voltage, and hence, the data in cell UC00 is thus ascertained.

A similar process may be used to read data from the other memory cells. A point to note is that to read data from one of the memory cells attached to bit line BL0, dummy cell 74 is used as a reference cell, and to read data from one of the memory cells attached to bit line BL1, dummy cell 72 is used as a reference cell. An advantage of this reading method is that it allows for stray capacitance canceling. More specifically, since the memory cell UC00 and the dummy cell 74 have substantially the same construction, and since bit lines BL0 and BL1 are substantially symmetrical, the effects of stray capacitance will be substantially the same for both cells. These effects will cancel each other out when the comparator 76 compares the voltages on the two bit lines BL0, BL1. Thus, a true comparison of the memory cell voltage and the reference voltage is obtained. This contributes to a more accurate determination of the data stored within the memory cell.

What is claimed is:

1. A memory cell for storing a plurality of bits of information comprising:

a storage capacitor capable of storing one of more than two different voltage levels, said capacitor having a first terminal and a second terminal:

a switching element comprising:

a first switching component, having a coupling terminal coupled to the first terminal of said capacitor, a data terminal coupled to a conductive line, and a control terminal coupled to a control line, for selectively coupling said capacitor to said conductive line, said first switching component having a threshold voltage which is positive; and a complementary switching component, having a coupling terminal coupled to the first terminal of said capacitor, a data terminal coupled to said conductive line, and a control terminal coupled to a second control line, for selectively coupling said capacitor to said conductive line, said complementary switching component having a threshold voltage which is negative; and a discharge element coupled to the first and second terminals of said capacitor for selectively discharging said capacitor.

2. The memory cell of claim 1, wherein said discharge element comprises:

a third switching component having a terminal coupled to the first terminal of said capacitor, another terminal coupled to the second terminal of said capacitor, and a control terminal coupled to a third control line, said third switching component having a threshold voltage which is positive; and a fourth switching component having a terminal coupled to the first terminal of said capacitor, another terminal coupled to the second terminal of said capacitor, and a control terminal coupled to a fourth control line, said fourth switching component having a threshold voltage which is negative.

3. The memory cell of claim 2, wherein said third switching component is a transistor selected from the group consisting of n-channel MOSFET, npn BJT, n-type JFET, n-channel MESFET, and n-channel MISFET.

4. The memory cell of claim 3, wherein said fourth switching component is a transistor selected from the group consisting of p-channel MOSFET, pnp BJT, p-type JFET, p-channel MESFET, and p-channel MISFET.

5. The memory cell of claim 3, wherein said first switching component is a transistor selected from the group consisting of n-channel MOSFET, npn BJT, n-type JFET, n-channel MESFET, and n-channel MISFET, and wherein said complementary switching component is a transistor selected from the group consisting of p-channel MOSFET, pnp BJT, p-type JFET, p-channel MESFET, and p-channel MISFET.

6. The memory cell of claim 5, further comprising:

an isolating element coupled to the second terminal of said capacitor, said isolating element selectively electrically isolating said capacitor from noise generated by other components.

7. The memory cell of claim 6, wherein said isolating element comprises:

a third switching component, having a terminal coupled to the second terminal of said capacitor, another terminal coupled to a second conductive line, and a control terminal coupled to a third control line, for selectively coupling said capacitor to said second conductive line, said third switching component having a threshold voltage which is positive; and a fourth switching component, having a terminal coupled to the second terminal of said capacitor, another terminal coupled to said second conductive line, and a control terminal coupled to fourth control line, for selectively coupling said capacitor to said second conductive line, said fourth switching component having a threshold voltage which is negative.

8. The memory cell of claim 7, wherein said third switching component is a transistor selected from the group consisting of n-channel MOSFET, npn BJT, n-type JFET, n-channel MESFET, and n-channel MISFET.

9. The memory cell of claim 8, wherein said fourth switching component is a transistor selected from the group consisting of p-channel MOSFET, pnp BJT, p-type JFET, p-channel MESFET, and p-channel MISFET.

10. The memory cell of claim 5, further comprising:

a discharge element coupled to the first and second terminals of said capacitor for selectively discharging said capacitor.

11. The memory cell of claim 10, wherein said discharge element comprises:

a third switching component having a terminal coupled to the first terminal of said capacitor, another terminal coupled to the second terminal of said capacitor, and a control terminal coupled to a third control line, said third switching component having a threshold voltage which is positive; and a fourth switching component having a terminal coupled to the first terminal of said capacitor, another terminal coupled to the second terminal of said capacitor, and a control terminal coupled to a fourth control line, said fourth switching component having a threshold voltage which is negative.

12. The memory cell of claim 11, wherein said third switching component is a transistor selected from the group consisting of n-channel MOSFET, npn BJT, n-type JFET, n-channel MESFET, and n-channel MISFET.

13. The memory cell of claim 12, wherein said fourth switching component is a transistor selected from the group consisting of p-channel MOSFET, pnp BJT, p-type JFET, p-channel MESFET, and p-channel MISFET.

14. A memory, comprising:

a first bit line;

a second bit line;

a first set of multi-bit memory cells coupled to said first bit line;

a second set of multi-bit memory cells coupled to said second bit line;

a first dummy cell coupled to said first bit line;

a second dummy cell coupled to said second bit line; and a comparator having inputs and an output, said inputs being coupled to said first and second bit lines;

wherein at least one of said multi-bit memory cells comprises:

a storage capacitor capable of storing one of more than two different voltage levels, said capacitor having a first terminal and a second terminal; and a switching element comprising:

a first switching component, having a coupling terminal coupled to the first terminal of said capacitor, a data terminal coupled one of said bit lines, and a control terminal coupled to a control line, for selectively coupling said capacitor to said one bit line, said first switching component having a threshold voltage which is positive; and a complementary switching component, having a coupling terminal coupled to the first terminal of said capacitor, a data terminal coupled to said one bit line, and a control terminal coupled to a second control line, for selectively coupling said capacitor to said one bit line, said complementary switching component having a threshold voltage which is negative.

15. The memory of claim 14, further comprising a discharge element coupled to said first and second bit lines for discharging said bit lines.

* * * * *